United States Patent [19]
Formanek et al.

[11] Patent Number: 5,128,207
[45] Date of Patent: Jul. 7, 1992

[54] METHOD FOR PRODUCING UNIFORM POLYMETHYLMETHACRYLATE LAYERS

[75] Inventors: Helmut Formanek; Magdalena Hintermaier, both of Munich; Erwin Knapek, Unterhaching; Burkhard Lischke, Munich, all of Fed. Rep. of Germany

[73] Assignee: Siemens Aktiengesellschaft, Munich, Fed. Rep. of Germany

[21] Appl. No.: 446,792

[22] Filed: Dec. 6, 1989

[30] Foreign Application Priority Data

Mar. 8, 1989 [DE] Fed. Rep. of Germany ....... 3907534

[51] Int. Cl.⁵ ........................................... B32B 27/00
[52] U.S. Cl. .................................. 428/339; 427/240; 427/302; 427/385.5; 428/500
[58] Field of Search ............... 427/385.5, 240, 301, 427/302; 428/500, 339

[56] References Cited

U.S. PATENT DOCUMENTS

| 4,352,839 | 10/1982 | Olson et al. | 427/385.5 |
| 4,741,926 | 5/1988 | White et al. | 427/240 |

OTHER PUBLICATIONS

Hackh's Chemical Dictionary pp. 250–252 Sep. 1977.

*Primary Examiner*—Michael Lusignan
*Attorney, Agent, or Firm*—Hill, Van Santen, Steadman & Simpson

[57] ABSTRACT

A method for producing smooth uniform polymethylmethacrylate (PMMA) layers having a thickness of greater than 20 μm. The PMMA layers are produced utilizing a solution of polymethylmethacrylate in an ester of lactic acid. The PMMA layers are particularly suited for micro-structuring techniques which utilize high-energy, ionizing radiation. The PMMA layers exhibit a good adhesion to metallic, semi-conducting and insulating substrates.

19 Claims, 1 Drawing Sheet

METHOD FOR PRODUCING UNIFORM POLYMETHYLMETHACRYLATE LAYERS

BACKGROUND OF THE INVENTION

The present invention relates to a method for producing
polymethylmethacrylate layers having varying thicknesses.

Polymethylmethacrylate (PMMA) can be used as a photoresist for lithographic structuring with high-energy, ionizing radiation. To this end, a thin PMMA layer is applied to various substrates, which are composed of metallic, semi-conducting, or insulating materials. An "image" is then generated in the PMMA layer utilizing electron beams or through x-ray lithography. After a wet-chemical development, the "image" is converted into a structure of PMMA. This structure represents a positive image.

The resultant PMMA structure can function as a mask for additional fabrication steps. In particular, structures, suitable for micro-electronic and other micro components, can be produced on the substrate. This can be achieved through etching, doping, or deposition of arbitrary, additional materials, including metallic materials.

Similar to the application of a standard photoresist, the application of PMMA layers proceeds in solution, for example, through dribbling or by whirling. Solvents that can be used for this purpose include chlorobenzene and methylisobutylketone.

Although the production of simple, thin photoresist layers are possible, it is not possible to produce uniform, smooth layers, having a thickness per layer of greater than 20 $\mu$m, utilizing known solvents. Thick layers created utilizing known solvents exhibit a grainy surface. Moreover, the surface of such thick layers is under a mechanical stress and tends to form cracks. Additionally, for producing thicker layers, a more concentrated and, thus, a more viscous solution of PMMA is required. Such a concentrated solution of PMMA cannot be prepared with known solvents.

Heretofore, a PMMA layer having a thickness greater than 20 $\mu$m could only be achieved by gluing thin PMMA foils together utilizing a cyanacrylate adhesive. This process, however, is a very involved, costly and time intensive method. Another possible way to attempt to produce arbitrary structures, having a thickness of more than 20 $\mu$m and also having a high aspect ratio, is by utilizing a two-component reaction resins. This technique, among other things, is extremely involved due to the complicated mixing and dosing of the two resin components.

SUMMARY OF THE INVENTION

The present invention provides a method for producing PMMA layers that are especially uniform and can have varying layer thicknesses greater than 20 $\mu$m. To this end, the present invention provides a method for producing polymethylmethacrylate layers having an adjustable thickness comprising the steps of: producing a solution of polymethylmethacrylate in an ester of lactic acid; applying the solution on a substrate in a uniform layer; drying the layer by evaporation of the solvent; and, as necessary, repeating the above steps.

In an embodiment of the present invention, the ester of lactic acid is ethyl lactate.

In an embodiment of the present invention, the polymethylmethacrylate layer can be applied by whirling.

In an embodiment of the present invention, the thickness of the polymethylmethacrylate layer on the substrate can be controlled by setting the polymethylmethacrylate concentration in the ester of lactic acid or by controlling the whirling speed.

In an embodiment of the present invention, the substrate surface is pre-treated before the application of the polymethylmethacrylate layer.

In an embodiment of the present invention, the substrate is pre-treated with a substance chosen from the group consisting of glycyrrhetinic acid and glucosides thereof, prior to the application of the polymethylmethacrylate layer.

In an embodiment of the present invention, the polymethylmethacrylate solution can include further constituents which are selected dependent on the quality of the substrate surface.

In an embodiment of the present invention, the polymethylmethacrylate solution is heated while being produced.

In an embodiment, the PMMA layer is used as a mask for structuring micro-electronic and micro components.

Additional features and advantages of the present invention are described in and will be apparent from, the detailed description of the presently preferred embodiments and from the drawings.

DETAILED DESCRIPTION OF THE PRESENTLY PREFERRED EMBODIMENTS

Figure 1:
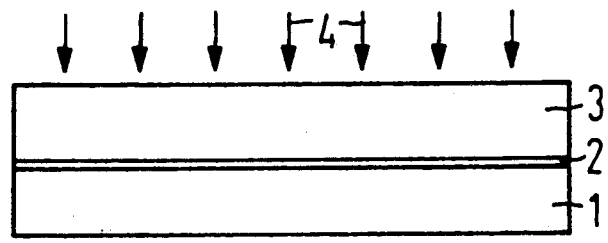
FIG. 1 illustrates a substrate having a polymethylmethacrylate layer and x-radiation being applied thereto.

The present invention provides a method for producing polymethylmethacrylate (PMMA) layers that are especially uniform and can have varying layer thickness above 20 $\mu$m per layer. Utilizing the method of the present invention, uniform PMMA layers having smooth surfaces can be produced having a thickness up to about 40 $\mu$m. The layers produced have a quality which was hitherto unobtainable by any known method. The method of the present invention is also distinguishable by the harmless nature of the solvent utilized. Particularly, when compared to the known solvent chlorobenzene, an ester of lactic acid is advantageous in that it is not a health hazard, and, additionally, is biodegradable. Because of its harmless nature, the process of the present invention can be carried out in an open system, making the method of the present invention simpler than previously known methods.

In an embodiment, ethyl lactate is utilized. To date, this has been found to be the best solvent for PMMA. Through its use, homogeneous solutions, containing up to 5 weight percent PMMA, can be produced. Typically, solutions, containing about 1 weight percent PMMA, are utilized. It should be noted that the concentration of the solution determines the layer thickness obtainable in one work cycle. The more concentrated or, respectively, viscous, the solution is, the greater the obtainable layer thickness. The production of more concentrated solutions can particularly be promoted and accelerated by heating. Two further possible ways to set the layer thickness are: through the selection of a different degree of polymerization of the PMMA material; and by controlling the speed when the PMMA is produced on the substrate through whirling.

The surface quality of the substrate is another factor that influences the production of a PMMA layer on a substrate. An excessively high or low substrate surface energy can have a negative influence on the spread of the PMMA layer, i.e., the flow of the PMMA solution on the substrate. As necessary, the substrate can be pre-treated with suitable surface-active substances before the application of the PMMA layer.

Additional measures may be required that can be utilized, particularly when using silicon and glass substrates. Adhesion problems can arise therein that, given thicker PMMA layers, can lead to a loosening of the layers. This problem can be alleviated by a pre-treatment of the substrate surface with an adhesive promoter, for example, a detergent. In this regard, glycyrrhetinic acid, or the glucosides thereof, have been found to function satisfactorily for this pre-treatment of the substrate. In an embodiment, the glycyrrhetinic acid, or glucosides thereof, are employed in a 0.01 weight percent solution in ethanol or water. Utilizing a pre-treatment of glycyrrhetinic acid, a substance related to steroids, has been found to result in excellent adhesion of PMMA layers thicker than 20 μm, on all substrates having arbitrarily fashioned surfaces.

It has also been found, given electron bombardment of thin PMMA layers (a few hundred nanometers thick), that PMMA layers produced utilizing ethyl lactate solution can be developed so that they are residue-free. In contrast, PMMA layers, which are produced from a chlorobenzene solution, have residues that cannot be removed in the developing process. This is particularly true given electron over-exposure. As a result thereof, the success of further process steps is jeopardized. This is due to the fact that chloro radicals arise, even if there are only a small amount of chlorobenzene residues in the PMMA, given electron bombardment. The chlorine radicals lead to peroxidic crosslinking products, in the presence of oxygen that are no longer soluble in the developing process. These non-soluble products can be a significant contributing factor in that, for example, error-free masks cannot be produced for x-ray lithography.

By way of example, and not limitation, an example of the present invention, referring to the four figures, will now be given.

EXAMPLE

A solution containing 1 weight percent polymethylmethacrylate (PMMA) was produced in ethyl lactate. The solution was created by stirring PMMA granules into ethyl lactate. It should be noted that depending on the degree of polymerization of the PMMA, heating may be required to produce a homogeneous solution. The PMMA is completely dissolved after a few minutes.

FIG. 1 illustrates a semi-conductive substrate 1, for example silicon or an aluminum oxide ceramic, having a thin layer of metal 2, for example 1 μm copper. A few drops of an aqueous solution containing 0.01 weight percent glycyrrhetinic acid are whirled onto the substrate 1 or, respectively, onto the copper layer 2, to produce an adhesion promoting layer.

The prepared PMMA solution is then whirled on. Depending on the viscosity of the PMMA solution, the whirling speed, is set so that a uniformly thick and homogeneous layer 3 is produced, for example having a layer thickness of 20 μm. After a few minutes, adequate solvent will have evaporated at room temperature or, respectively, the layer 3 will be adequately dry so that it can be reinforced or, thickened, without problems by whirling additional PMMA solution onto the layer.

The two sub-layers of the layer 3 form one uniform overall layer without a noticeable transition between the two sub-layers. There are also no adhesion problems between the two sub-layers. The process results in a sub-layer 3 that has a thickness of 40 μm. The layer is then dried for about an hour at room temperature, and finally, it is structured with x-ray lithography. The x-ray lithography is done by exposing the layer 3 with x-radiation 4 through a contact mask (not shown). The mask thereby shadows defined regions of the layer 3 from the x-radiation 4.

Figure 2:
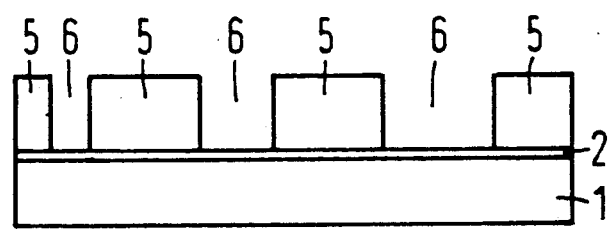
FIG. 2 illustrates the results of a wet-chemical developing process on the polymethylmethacrylate layer.

The x-radiation chemically modifies the PMMA in the exposed, non-shaded regions of the layer 3 in such a way as to dissolve it in a wet-chemical developing process. FIG. 2 illustrates the results of a wet-chemical developing process. The shadow regions remain as ridges 5 on the copper layer 2. The trenches 6, that have been dissolved out, have steep edges. The copper layer 2, which is exposed in the trenches 6, is filled with copper by galvanic deposition up to the upper edge of the ridges 5.

Figure 3:
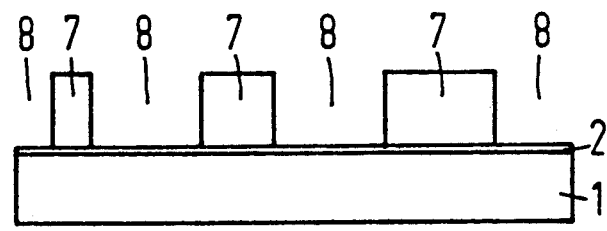
FIG. 3 illustrates trenches filled with copper and the polymethylmethacrylate layer etched away.

FIG. 3 illustrates the copper structure 7 corresponding to the filled trenches 6 after the ridges 5 have been dissolved by etching. In an additional etching process, copper is eroded from the entire surface by anisotropic etching until the original copper layer 2, exposed in the trenches 8, is removed.

Figure 4:
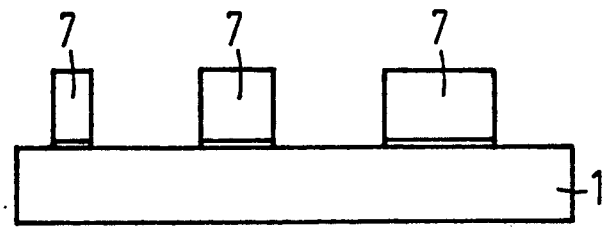
FIG. 4 illustrates the resultant product with the remaining copper layer etched away.

FIG. 4 illustrates the completed product. Only the copper structures 7 remain on the substrate 1. The copper structures represent a positive image of a pattern produced in the x-ray lithography by exposure. Previously, this type of galvano-plastically produced copper structures could only be produced utilizing an involved photoresist technique. Through the method of the present invention, the production of PMMA layers is significantly simplified. Since PMMA layers produced in such a fashion are also noticeably more uniform, more exact PMMA structures having a thickness of up to 40 μm can also be produced by the lithography process. This ultimately enables the manufacture of more exact compound structures, for example, galvano-plastically produced metal structures.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for producing a uniform polymethylmethacrylate layer on a substrate, the layers capable of being set to an arbitrary thickness comprising the steps of:

a) producing a solution of polymethylmethacrylate in an ester of lactic acid solvent;

b) applying the solution on a substrate in a uniform layer; and c) drying the layer by evaporation of the solvent.

2. The method of claim 1 wherein the ester of lactic acid is ethyl lactate.

3. The method of claim 1 wherein the thickness of the polymethylmethacrylate layer on the substrate is controlled by setting the polymethylmethacrylate concentration in the ester of lactic acid solution.

4. The method of claim 1 wherein the polymethylmethacrylate layer is applied through whirling.

5. The method of claim 4 wherein the thickness of the polymethylmethacrylate layer is set by controlling the application speed onto the layer by whirling.

6. The method of claim 1 wherein the substrate surface is pre-treated before the application of the polymethylmethacrylate layer.

7. The method of claim 1 wherein the substrate is pre-treated with a substance chosen from the group consisting of glycyrrhetinic acid and glucosides thereof, before the application of the polymethylmethacrylate layer.

8. The method of claim 1 wherein the polymethylmethacrylate solution is heated while it is being produced.

9. The product of the process of claim 1, in which the thickness of the polymethylmethacrylate layer ranges from greater than 20 $\mu$m through approximately 40 $\mu$m.

10. The product of the process of claim 2, in which the thickness of polymethylmethacrylate layer ranges from greater than 20 $\mu$m through approximately 40 $\mu$m.

11. The product of the process of claim 4, in which the thickness of the polymethylmethacrylate layer ranges from greater than 20 $\mu$m through approximately 40 $\mu$m.

12. A method for producing a uniform polymethylmethacrylate layer on a substrate comprising the steps of:

a) creating a solution of polymethylmethacrylate in an ethyl lactate;

b) treating a substrate;

c) applying the solution on the substrate in a uniform layer; and d) evaporating the ethyl lactate.

13. The method of claim 12 wherein the thickness of the polymethylmethacrylate layer on the substrate is controlled by setting the polymethylmethacrylate concentration in the ester of lactic acid solution.

14. The method of claim 12 wherein the polymethylmethacrylate layer is applied by whirling.

15. The method of claim 14 wherein the thickness of the polymethylmethacrylate layer is set by controlling the application speed onto the layer by whirling.

16. The method of claim 12 wherein the substrate is pretreated with a substance chosen from the group consisting of glycyrrhetinic acid and glucosides thereof, before the application of the polymethylmethacrylate layer.

17. The method of claim 12 wherein the polymethylmethacrylate solution is heated while it is being created.

18. The product of the process of claim 12, in which the thickness of the polymethylmethacrylate layer ranges from greater than 20 $\mu$m through approximately 40 $\mu$m.

19. The product of the process of claim 14, in which the thickness of the polymethylmethacrylate layer ranges from greater than 20 $\mu$m through approximately 40 $\mu$m.

* * * * *